United States Patent
Kim et al.

(10) Patent No.: US 8,324,043 B2
(45) Date of Patent: Dec. 4, 2012

(54) METHODS OF MANUFACTURING SEMICONDUCTOR DEVICES WITH SI AND SIGE EPITAXIAL LAYERS

(75) Inventors: Jin-bum Kim, Seoul (KR); Si-young Choi, Seongnam-si (KR); Hyung-ik Lee, Suwon-si (KR); Ki-hong Kim, Ansan-si (KR); Yong-koo Kyoung, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 13/137,733

(22) Filed: Sep. 8, 2011

(65) Prior Publication Data

US 2012/0003799 A1 Jan. 5, 2012

(30) Foreign Application Priority Data

Nov. 20, 2008 (KR) .................. 10-2008-0115801

(51) Int. Cl.
*H01L 21/8238* (2006.01)
(52) U.S. Cl. ........ 438/233; 438/300; 438/655; 438/682; 438/231; 257/E21.634
(58) Field of Classification Search .................. 438/231, 438/233, 300, 303, 305, 306, 307, 655, 682; 257/E21.43, E21.619, E21.634
See application file for complete search history.

(56) References Cited

U.S. PATENT DOCUMENTS

| | | | | |
|---|---|---|---|---|
| 4,861,393 A * | 8/1989 | Bean et al. | .................. | 148/33.4 |
| 5,496,750 A * | 3/1996 | Moslehi | ................. | 438/297 |
| 6,214,679 B1 * | 4/2001 | Murthy et al. | ................ | 438/299 |
| 6,218,711 B1 * | 4/2001 | Yu | .................. | 257/384 |
| 6,235,568 B1 * | 5/2001 | Murthy et al. | ................ | 438/231 |
| 6,346,447 B1 * | 2/2002 | Rodder | ................. | 438/300 |
| 6,479,358 B1 * | 11/2002 | Yu | .................. | 438/300 |
| 6,545,317 B2 * | 4/2003 | Hokazono et al. | ............ | 257/336 |
| 6,555,880 B2 * | 4/2003 | Cabral et al. | .................. | 257/384 |
| 6,617,654 B2 * | 9/2003 | Oishi et al. | .................... | 257/382 |
| 6,787,864 B2 * | 9/2004 | Paton et al. | .................... | 257/412 |
| 6,815,707 B2 | 11/2004 | Sugii et al. | | |
| 6,852,600 B1 * | 2/2005 | Wang et al. | .................. | 438/301 |
| 6,906,360 B2 * | 6/2005 | Chen et al. | .................... | 257/204 |
| 6,943,407 B2 | 9/2005 | Ouyang et al. | | |
| 6,946,371 B2 * | 9/2005 | Langdo et al. | ................ | 438/481 |

(Continued)

FOREIGN PATENT DOCUMENTS

JP 2006-351581 12/2006

(Continued)

*Primary Examiner* — Mary Wilczewski
(74) *Attorney, Agent, or Firm* — Harness, Dickey & Pierce, P.L.C.

(57) ABSTRACT

Methods of manufacturing semiconductor devices may include forming a first layer on a first active region (P-channel FET), forming a second layer on a second active region (N-channel FET), the first and second layers including a silicon germanium (SiGe) epitaxial layer sequentially stacked on a silicon (Si) epitaxial layer, forming a first contact hole in an interlayer insulating film including a first lower region exposing the SiGe epitaxial layer of the first layer, forming a second contact hole in the interlayer insulating film including a second lower region penetrating through the SiGe epitaxial layer of the second layer and exposing the Si epitaxial layer of the second layer, forming a first metal silicide film including germanium (Ge) in the first lower region, forming a second metal silicide film not including Ge in the second lower region simultaneously with the forming of the first metal silicide film.

5 Claims, 9 Drawing Sheets

U.S. PATENT DOCUMENTS

| | | | | |
|---|---|---|---|---|
| 6,949,482 | B2* | 9/2005 | Murthy et al. | 438/739 |
| 7,045,432 | B2* | 5/2006 | Orlowski et al. | 438/300 |
| 7,060,546 | B2* | 6/2006 | Hsu et al. | 438/197 |
| 7,118,977 | B2* | 10/2006 | Chidambaram et al. | 438/300 |
| 7,122,449 | B2* | 10/2006 | Langdo et al. | 438/481 |
| 7,132,338 | B2* | 11/2006 | Samoilov et al. | 438/300 |
| 7,172,933 | B2* | 2/2007 | Huang et al. | 438/197 |
| 7,176,522 | B2* | 2/2007 | Cheng et al. | 257/338 |
| 7,244,654 | B2* | 7/2007 | Chidambaram et al. | 438/300 |
| 7,335,566 | B2* | 2/2008 | Ning et al. | 438/300 |
| 7,348,248 | B2* | 3/2008 | Cheng | 438/301 |
| 7,354,835 | B2* | 4/2008 | Shin et al. | 438/300 |
| 7,381,623 | B1* | 6/2008 | Chen et al. | 438/300 |
| 7,390,707 | B2* | 6/2008 | Kawamura et al. | 438/197 |
| 7,413,957 | B2* | 8/2008 | Nouri et al. | 438/300 |
| 7,432,559 | B2* | 10/2008 | Lai et al. | 257/377 |
| 7,432,560 | B2 | 10/2008 | Lim et al. | |
| 7,528,065 | B2* | 5/2009 | Clevenger et al. | 438/638 |
| 7,534,689 | B2* | 5/2009 | Pal et al. | 438/300 |
| 7,544,997 | B2* | 6/2009 | Zhang et al. | 257/344 |
| 7,592,214 | B2* | 9/2009 | Ohta | 438/199 |
| 7,592,619 | B2* | 9/2009 | Tsai et al. | 257/19 |
| 7,611,938 | B2* | 11/2009 | Cheng et al. | 438/199 |
| 7,615,829 | B2* | 11/2009 | Lochtefeld et al. | 257/377 |
| 7,718,500 | B2* | 5/2010 | Chong et al. | 438/300 |
| 7,781,848 | B2 | 8/2010 | Ito et al. | |
| 7,795,689 | B2* | 9/2010 | Kawakita | 257/369 |
| 7,880,228 | B2* | 2/2011 | Yasutake | 257/344 |
| 7,948,040 | B2 | 5/2011 | Yamazaki et al. | |
| 8,039,902 | B2* | 10/2011 | Kim et al. | 257/377 |
| 2004/0262683 | A1* | 12/2004 | Bohr et al. | 257/338 |
| 2005/0059236 | A1 | 3/2005 | Nishida et al. | |
| 2005/0280095 | A1 | 12/2005 | Nabatame et al. | |
| 2005/0282324 | A1* | 12/2005 | Ohuchi | 438/198 |
| 2006/0170047 | A1 | 8/2006 | Ishimaru | |
| 2007/0080392 | A1 | 4/2007 | Tomiye | |
| 2007/0099370 | A1 | 5/2007 | Nakajima et al. | |
| 2007/0148939 | A1 | 6/2007 | Chu et al. | |
| 2007/0238236 | A1* | 10/2007 | Cook et al. | 438/197 |
| 2008/0023772 | A1* | 1/2008 | Kawakita | 257/369 |
| 2008/0290421 | A1 | 11/2008 | Wang et al. | |
| 2008/0315322 | A1 | 12/2008 | Obeng et al. | |
| 2010/0123198 | A1 | 5/2010 | Kim et al. | 257/377 |
| 2011/0006344 | A1* | 1/2011 | Murthy et al. | 257/190 |
| 2012/0003799 | A1* | 1/2012 | Kim et al. | 438/233 |

FOREIGN PATENT DOCUMENTS

| | | |
|---|---|---|
| JP | 2008-028324 | 2/2008 |
| JP | 2008-047586 | 2/2008 |

* cited by examiner

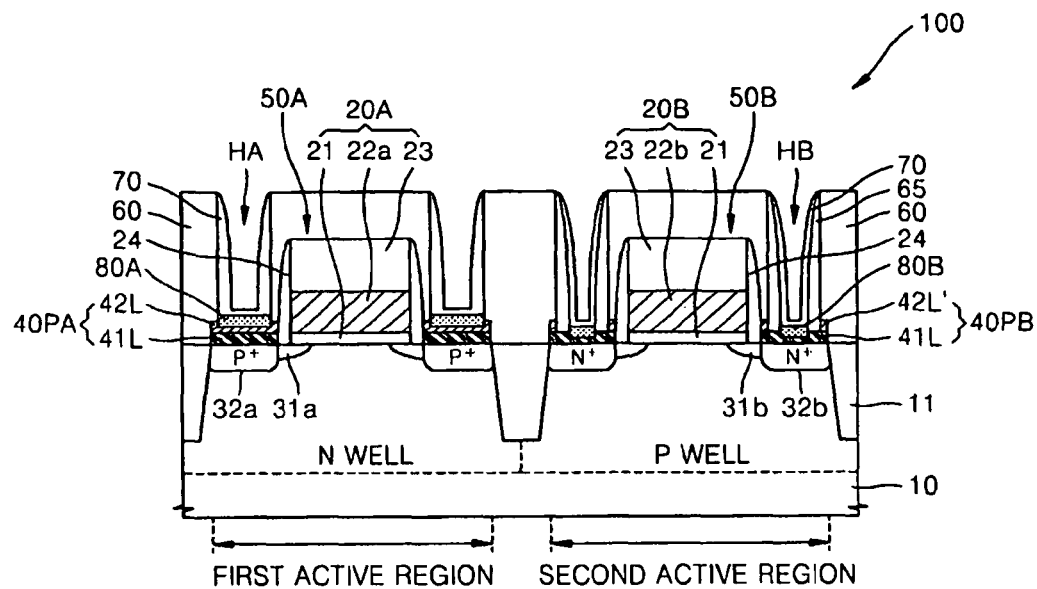

METHODS OF MANUFACTURING SEMICONDUCTOR DEVICES WITH SI AND SIGE EPITAXIAL LAYERS

PRIORITY STATEMENT

This application is a divisional under 35 U.S.C. §121 of U.S. application Ser. No. 12/591,249, filed on Nov. 13, 2009 now U.S. Pat. No. 8,039,902, which claims priority under 35 U.S.C. §119 to Korean Patent Application No. 10-2008-0115801, filed on Nov. 20, 2008, in the Korean Intellectual Property Office (KIPO), the entire contents of each of which are incorporated herein by reference.

BACKGROUND

1. Field

Example embodiments relate to semiconductor devices and methods of manufacturing the same, and more particularly, to field-effect transistors including one or more low resistance contacts and methods of manufacturing the same.

2. Description of the Related Art

Electronic devices such as computers, cellular phones, and digital cameras require an active element in order to implement logic circuits. A complementary metal-oxide semiconductor (CMOS) transistor having low power driving and high linear characteristics has been commonly used as the active element.

Currently, design rules of semiconductor devices have been narrowed in order to manufacture electronic products with lighter weight and small and/or decreased form factor. Accordingly, a contact area of a source/drain region of the CMOS transistor has been reduced. Because the reduction of the contact area increases contact resistance, reduction of contact resistance is an important issue with respect to high integration density CMOS transistor devices.

The CMOS transistor includes P-channel and N-channel metal-oxide semiconductor field-effect transistors (MOSFETs) connected to each other in series. In order to provide a low resistance contact to a CMOS transistor, the P-channel and N-channel MOSFETs need to be provided with a contact having a low Schottky barrier. Conventionally, a technology for reducing the Schottky barrier of a contact by applying metal silicide films having different work functions respectively to P-channel and N-channel MOSFETs has been suggested.

In order to apply different metal silicide films to the P-channel and N-channel MOSFETs, the silicide films of the P-channel and N-channel MOSFETs are independently formed by different processes. For example, in order to form a metal silicide film having a high work function (e.g., a PtSi film) in the P-channel MOSFET, a mask for completely blocking the N-channel MOSFET may be initially formed after which a high work function film may be formed in the P-channel MOSFET. In order to form a metal silicide film having a low work function (e.g., an ErSi film) in the N-channel MOSFET, the mask for blocking the N-channel MOSFET has to be removed so as to expose the N-channel MOSFET.

The process of forming a mask selectively for blocking one of P-channel and N-channel MOSFETs and then forming silicide films having different metals at the P-channel and N-channel MOSFETs through separate deposition processes requires additional photolithography and etching processes, thereby increasing process complexity and cost.

SUMMARY

Example embodiments provide semiconductor devices having reduced contact resistance for both P-channel and N-channel metal-oxide semiconductor field-effect transistors (MOSFETs), by including a silicide film in an N-Channel MOSFET having a different composition than a silicide film in a P-channel MOSFET, between source/drain regions and contact plugs of the MOSFETs. Example embodiments provide methods of manufacturing semiconductor devices without performing a blocking process.

According to example embodiments, there is provided a semiconductor device. The semiconductor device includes source regions, drain regions, first and second contact pad layers including silicon (Si) and SiGe epitaxial layers, the Si and SiGe epitaxial layers on the source and drain regions.

The semiconductor device may include an interlayer insulating film and first and second contact holes. According to example embodiments, the first contact hole may penetrate the interlayer insulating film and may include a first lower region that exposes the SiGe epitaxial layer of the first contact pad layer. The second contact hole may penetrate the interlayer insulating film and may include a second lower region penetrating through the SiGe epitaxial layer of the second contact pad layer, exposing the Si epitaxial layer. A diffusion barrier may be included between sidewalls of the second contact hole and the second metal silicide film. According to example embodiments, the first contact hole may penetrate the interlayer insulating film and may include a first lower region penetrating through the Si epitaxial layer of the first contact pad layer, exposing the SiGe epitaxial layer. The second contact hole may penetrate the interlayer insulating film and may include a second lower region exposing the Si epitaxial layer of the second contact pad layer. At least a portion of the SiGe epitaxial layer of the first contact pad layer may be buried in the first active region.

The semiconductor device may include a substrate having first and second active regions. P-channel and N-channel field-effect transistors may be on the first and second active regions, respectively, the P-channel and N-channel field-effect transistors including at least one of the first and second source and drain regions. The interlayer insulating film may be on the P-channel and the N-channel field-effect transistors. First and second metal silicide films may be respectively in the first and second lower regions of the contact holes. The first metal silicide film may contain germanium (Ge) and the second metal silicide film may not contain Ge. Contact plugs may be on the first and second metal silicide films and filled in the first and second contact holes. At least one of the first and second contact pad layers may extend in a direction parallel to a principal plane of the substrate and may extend over a region of a device isolation film defining the first and second active regions.

According to example embodiments, there is provided a semiconductor device. The semiconductor device includes source and drain regions, first and second contact pad layers including a silicon (Si) epitaxial layer and a germanium (Ge) atomic layer, where the Si epitaxial layer and Ge atomic layer are on the source and drain regions.

The semiconductor device may include an interlayer insulating film. First and second contact holes may penetrate the interlayer insulating film. The first contact hole may include a first lower region that exposes the Ge atomic layer of the first contact pad layer. The second contact hole may include a second lower region that penetrates through the Ge atomic layer of the second contact pad layer and exposes the Si epitaxial layer. The semiconductor device may include a substrate including first and second active regions. P-channel and N-channel field-effect transistors may be respectively on the first and second active regions and may include at least one of the source and drain regions. The interlayer insulating film may be on the P-channel and the N-channel field-effect transistors. First and second metal silicide films may be respectively in the first and second lower regions of the contact holes, where the first metal silicide film may contain Ge and the second metal silicide film may not contain Ge. Contact plugs may be on the first and second metal silicide films and filled in the first and second contact holes.

According to example embodiments, there is provided a method of manufacturing a semiconductor device. The method includes forming a first active region for a P-channel field-effect transistor and a second active region for an N-channel field-effect transistor in a substrate, forming a first gate stack on the first active region, forming a second gate stack on the second active region, simultaneously forming first and second layers on regions of the first and second active regions where the first and second gate stacks are not formed, the first and second layers including a silicon germanium (SiGe) epitaxial layer sequentially stacked on a silicon (Si) epitaxial layer.

Example embodiments may include forming an interlayer insulating film to cover upper regions of the first and second gate stacks and the first and second layers. A first contact hole may be formed in the interlayer insulating film, the first contact hole including a first lower portion to expose the SiGe epitaxial layer of the first layer. A second contact hole may be formed in the interlayer insulating film, the second contact hole including a second lower region penetrating through the SiGe epitaxial layer of the second layer and exposing the Si epitaxial layer. First and second metal silicide films may be formed respectively in the first and second lower regions of the contact holes, where the first metal silicide film may include germanium (Ge) and the second metal silicide film may not include Ge. Contact plugs may be formed on the first and second metal silicide films so as to be filled in the first and second contact holes According to example embodiments, there is provided a method of manufacturing a semiconductor device. The method includes forming a first active region for a P-channel field-effect transistor and a second active region for an N-channel field-effect transistor in a substrate, forming a first gate stack on the first active region, forming a second gate stack on the second active region and simultaneously forming first and second layers on regions of the first and second active regions where the first and second gate stacks are not formed, the first and second layers including a silicon (Si) epitaxial layer sequentially stacked on a silicon germanium (SiGe) layer.

An interlayer insulating film may be formed to cover upper regions of the first and second gate stacks and the first and second layers. A first contact hole may be formed in the interlayer insulating film, the first contact hole including a first lower region penetrating through the Si epitaxial layer of the first layer and exposing the SiGe epitaxial layer. A second contact hole may be formed in the interlayer insulating film, the second contact hole including a second lower region exposing the Si epitaxial layer of the second layer. First and second metal silicide films may be respectively formed in the first and second lower regions, simultaneously, where the first metal silicide film may include germanium (Ge) and the second metal silicide film may not include Ge. Contact plugs may be formed on the first and second metal silicide films so as to be filled in the first and second contact holes.

BRIEF DESCRIPTION OF THE DRAWINGS

Example embodiments will be more clearly understood from the following brief description taken in conjunction with the accompanying drawings. FIGS. 1A-5 represent non-limiting, example embodiments as described herein.

FIGS. 1A-1F are cross-sectional diagrams illustrating methods of manufacturing a semiconductor device according to example embodiments;

FIG. 4 is a cross-sectional diagram illustrating methods of manufacturing a semiconductor device according to example embodiments; and FIG. 5 is a cross-sectional diagram illustrating methods of manufacturing a semiconductor device according to an example embodiment.

Figure 1A:
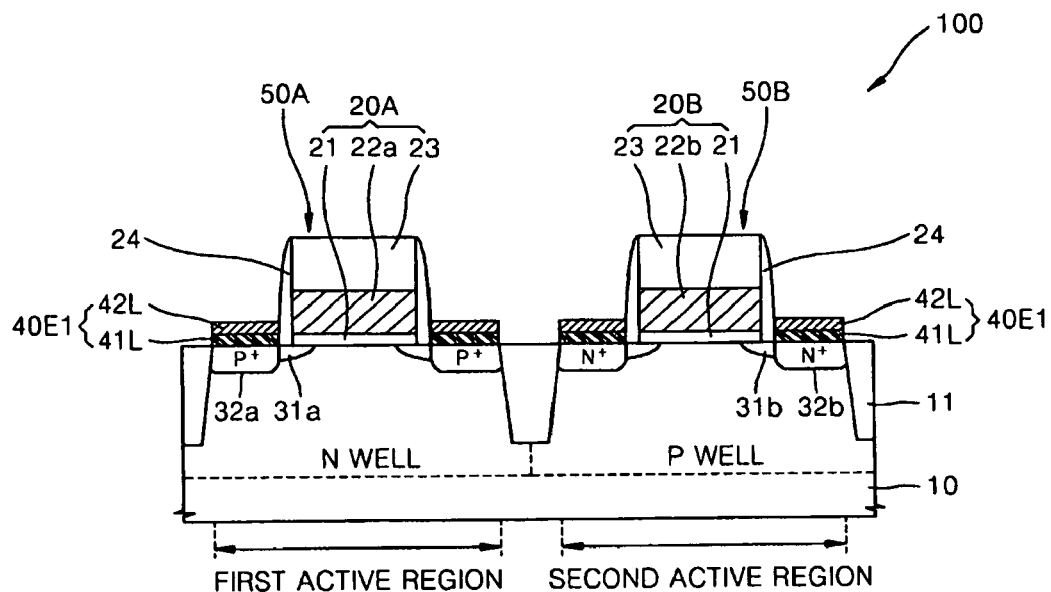

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, a field-effect transistor can be interchangeably used with a metal-oxide semiconductor field-effect transistor (MOSFET), a channel MOSFET, or a metal-insulator-semiconductor field-effect transistor (MISFET). Although a field-effect transistor having a flat channel is described by example herein, it will be understood by one of ordinary skill in the art that many configurations are possible, for example, a metal-oxide semiconductor (MOS) transistor having a pin-type or recessed channel.

FIGS. 1A-1F are cross-sectional diagrams illustrating methods of manufacturing a semiconductor device 100 according to example embodiments. Referring to FIG. 1A, a substrate 10 may include a first active region in which a P-channel field-effect transistor 50A is to be formed and a second active region in which an N-channel field-effect transistor 50B is to be formed. The substrate 10 may be a substrate that is subjected to a semiconductor device manufacturing process, for example, a silicon (Si) monocrystalline substrate, a silicon-on-insulator (SOI) substrate, and/or a silicon-on-sapphire (SOS) substrate.

The first and second active regions of the substrate 10 may be defined by a device isolation film 11 (e.g., a shallow trench isolation (STI) film). The substrate 10 may include N and P wells respectively in the first and second active regions. If a specific conductive type substrate is used, one of the N and P wells may be omitted. For example, a P-channel substrate may be used as the substrate 10 and only the N well may be formed in the first active region of the substrate 10, or vice versa. First and second gate stacks 20A and 20B may be respectively formed on the first and second active regions. The first and second gate stacks 20A and 20B may be formed by forming a gate insulating layer 21, gate conductive films 22a and 22b, and optionally a capping film 23 on the first and second active regions, and then patterning the gate insulating layer 21, the gate conductive films 22a and 22b, and the capping film 23. The capping film 23 may protect the gate insulating layer 21 and the gate conductive films 22a and 22b.

The gate insulating layer 21 may include a silicon oxide film. However, example embodiments are not limited to a silicon oxide film. The gate insulating layer 21 may include a high-k dielectric film having a dielectric constant greater than that of the silicon oxide film. For example, the gate insulating layer may include a silicon nitride (SiNx) film, a tantalum oxide (TaOx) film, a hafnium oxide (HfOx) film, an aluminum oxide (AlOx) film, and/or a zinc oxide (ZnOx) film.

Each of the gate conductive films 22a and 22b may be, for example, a heavily-doped polysilicon film, a metal film (e.g., a tungsten (W), nickel (Ni), molybdenum (Mo) and/or cobalt (Co) film), a metal silicide film, or any combination thereof. For example, one combination included in the gate conductive films 22a and 22b may be a stacked film including a heavily-doped polysilicon film and a nickel cobalt silicide film. According to example embodiments, the gate conductive films 22a and 22b in the first and second gate stacks 20A and 20B may be materials having different work functions. For example, the gate conductive film 22a of the first gate stack 20A may be a metal silicide film and the gate conductive film 22b of the second gate stack 20B may be a metal film. The capping film 23 may be, for example, a silicon nitride film or a silicon oxide film.

According to one or more example embodiments, in order to prevent a hot carrier effect that may occur in drain regions of the P-channel and N-channel field-effect transistors 50A and 50B, lightly-doped drain (LDD) regions 31a and 31b, which may also be referred to as shallow source/drain extension (SDE) regions, may be formed by using the first and second gate stacks 20A and 20B as ion implantation masks. A gate spacer 24 may be formed on sidewalls of the first and second gate stacks 20A and 20B. The gate spacer 24 may be, for example, silicon nitride. Heavily-doped source/drain regions 32a and 32b may be formed by, for example, a high-concentration ion implantation into the first and second active regions using the first and second gate stacks 20A and 20B and the gate spacer 24 as a mask.

A Si epitaxial layer 41L may be formed simultaneously on the exposed source/drain regions 32a and 32b of the first and second active regions. A SiGe epitaxial layer 42L may be formed simultaneously on the Si epitaxial layer 41L of the first and second active regions. The thickness of the Si epitaxial layer 41L may be, for example, from about 10 Å to about 500 Å. The thickness of the SiGe epitaxial layer 42L may be, for example, from about 30 Å to about 500 Å. The molarity of germanium (Ge) in the SiGe epitaxial layer 42L may be from about 3% to about 50%.

The Si and SiGe epitaxial layers 41L and 42L may be formed by, for example, selective epitaxial growth (SEG). The Si epitaxial layer 41L may be formed by, for example, a chemical vapor deposition (CVD) at about 700° C. using a Si-containing gas (e.g., SiH4, Si2H6, and/or SiH2Cl2). The SiGe epitaxial layer 42L may be formed by, for example, growing SiGe crystal films on the Si epitaxial layer 41L using a mixed gas of a silicon-containing gas and a Ge-containing gas (e.g., GeH4 and/or GeH). However, example embodiments are not limited thereto. The Si and SiGe epitaxial layers 41L and 42L may also be formed by, for example, molecular beam epitaxy.

According to one or more embodiments, the Si and SiGe epitaxial layers 41L and 42L, which may grow in a direction perpendicular to the corresponding active regions, may also grow in a direction parallel to a principal plane of the substrate 10 so as to extend over a portion of the device isolation film 11. The extended Si and SiGe epitaxial layers 41L and 42L may secure photolithography process margins for subsequent processes (e.g., contact plug formation) and may reduce contact resistance due to the increased area of the upper surface of the Si and SiGe epitaxial layers 41L and 42L.

In order to provide conductivity to a double epitaxial layer 40E1 including the Si and SiGe epitaxial layers 41L and 42L on the first and second active regions, an ion implant may be performed with an ion implantation mask (not shown). For example, the double epitaxial layer 40E1 of the first active region may be doped by a group III element such as boron (B) and the double epitaxial layer 40E1 of the second active region may be doped by a group V element such as phosphorus (P) or arsenic (As). Alternatively, as described below with reference to FIGS. 1B and 1C, the ion implantation may be performed on a contact pad layer 40PA of the first active region, which is exposed after forming first contact holes HA, and may be performed on a contact pad layer 40PB of the second active region, which is exposed after forming second contact holes HB.

Figure 1B:
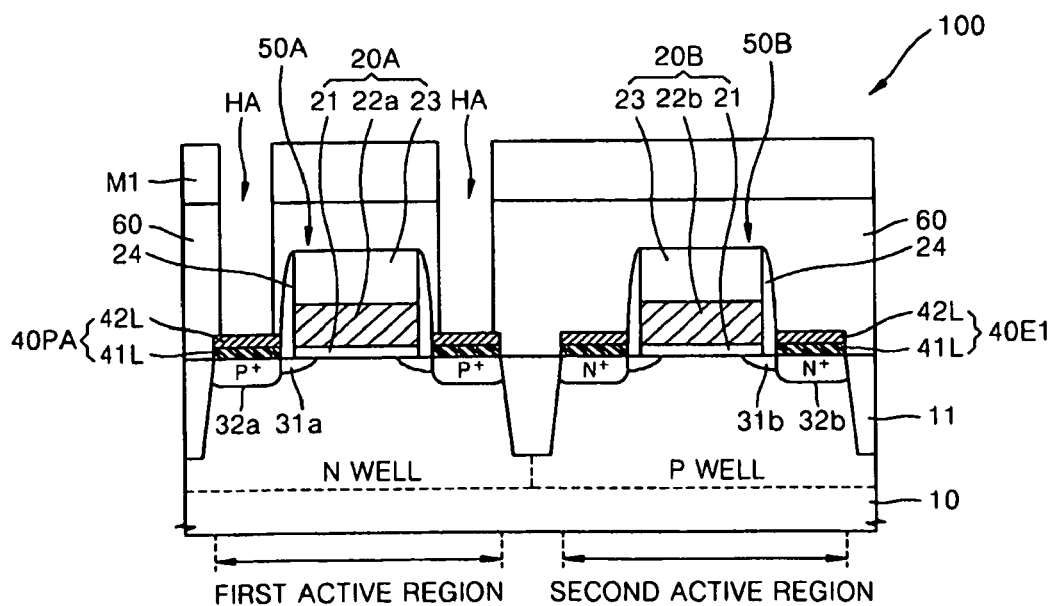

Referring to FIG. 1B, an interlayer insulating film 60 may be formed to cover upper regions of the P-channel and N-channel field-effect transistors 50A and 50B and the double epitaxial layer 40E1. The interlayer insulating film 60 may be, for example, silicon oxide, phosphosilicate glass (PSG), and/or borophosphosilicate glass (BPSG). As another example, the interlayer insulating film 60 may be formed of a low-k material such as impurity-doped CVD glass. However, example embodiments are not limited to the above materials.

The first contact holes HA may be formed in one of the first and second active regions, for example, the first active region as illustrated in FIG. 1B. In order to form the first contact holes HA, a mask M1 for exposing regions in which the first contact holes HA are to be formed, may be formed on the interlayer insulating film 60 by performing a photolithography process. The first contact holes HA may be formed in the interlayer insulating film 60 by, for example, performing a plasma dry etch. By controlling an etch depth of the first contact holes HA, a lower region of the first contact holes HA may expose the SiGe epitaxial layer 42L. The contact pad layer 40PA for the P-channel field-effect transistor 50A may be formed.

Figure 1C:
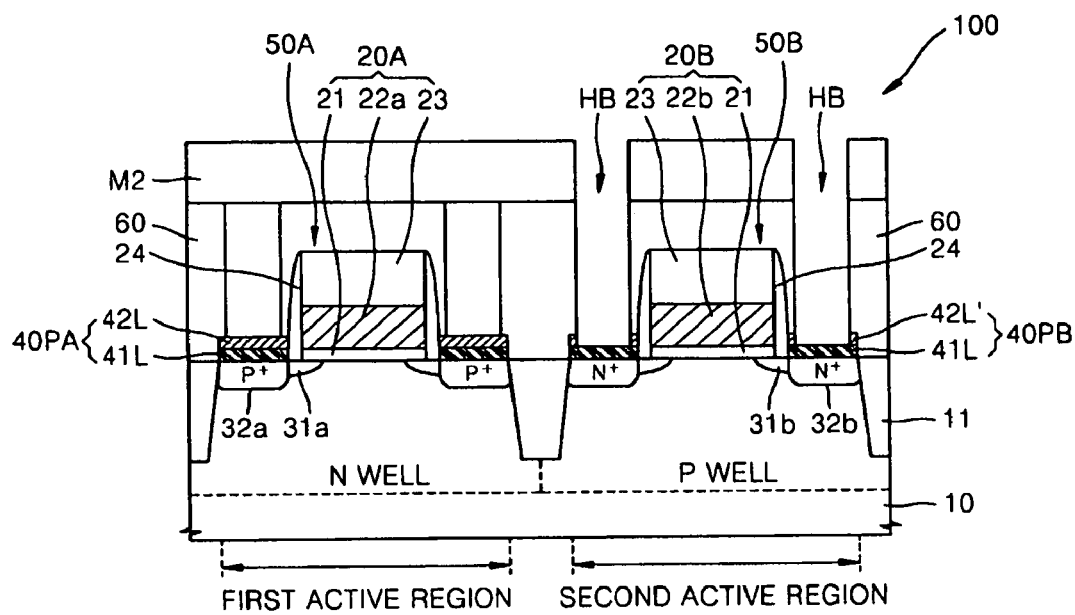

Referring to FIG. 1C, a mask M2 for exposing regions in which the second contact holes HB are to be formed may be formed on the interlayer insulating film 60 by performing a photolithography process. The second contact holes HB may be formed in the interlayer insulating film 60 by, for example, performing a plasma dry etch. By controlling an etch depth of the second contact holes HB, a lower region of the second contact holes HB may penetrate through a SiGe epitaxial layer 42L to expose the underlying Si epitaxial layer 41L. The contact pad layer 40PB for the N-channel field-effect transistor 50B may be formed. If a plasma dry etch is used, the plasma dry etch for the second contact holes HB may be continuously performed on the interlayer insulating film 60 and the SiGe epitaxial layer 42L by using the same etch gas. In some cases, the interlayer insulating film 60 and the SiGe epitaxial layer 42L may be discontinuously etched by using different etch gases in consideration of etch selectivity therebetween.

Figure 1D:
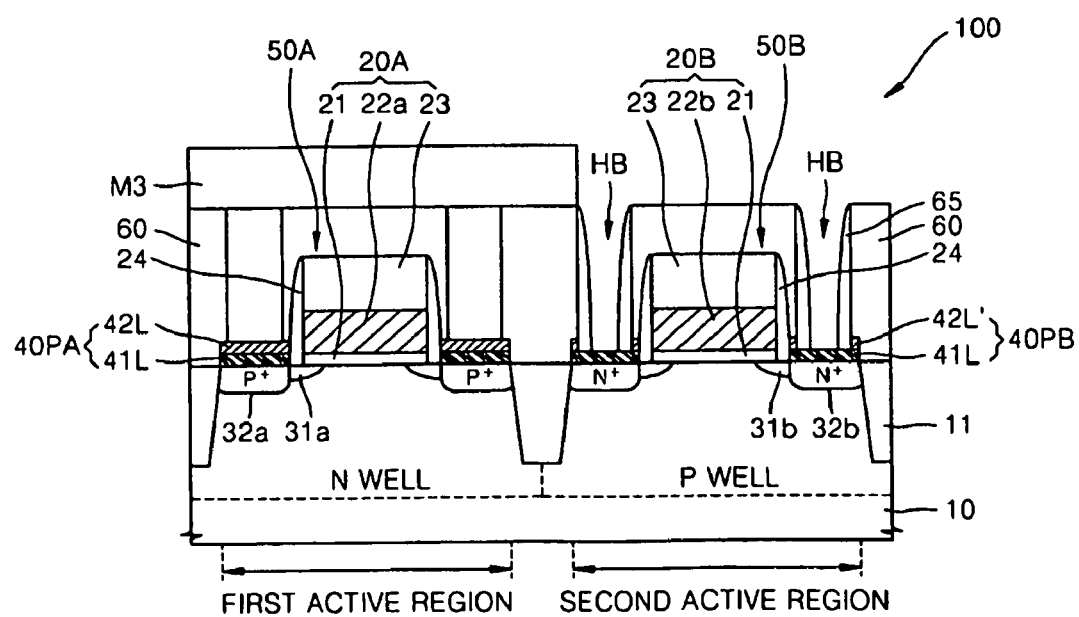

Referring to FIG. 1D, a diffusion barrier 65 may be formed on sidewalls of the second contact holes HB to cover the exposed SiGe epitaxial layer 42L'. The diffusion barrier 65 may be formed to prevent a silicide reaction between the exposed SiGe epitaxial layer 42L' and a barrier metal layer (see a reference numeral 70 of FIG. 1E). As illustrated in FIG. 1D, the diffusion barrier 65 may be a spacer formed on the sidewalls of the second contact holes HB. The thickness of the spacer may be from about 20 Å to about 500 Å. The spacer may be, for example, a silicon nitride film having etch selectivity with respect to the interlayer insulating film 60. The silicon nitride film may be formed, for example, in the second contact holes HB after forming a mask M3 for exposing the second contact holes HB and the insulating film 60 of the second active region. The diffusion barrier 65 may be formed as a spacer that covers the sidewalls of the second contact holes HB by performing an etch back process, where etch selectivity exists between the interlayer insulating film 60 and the silicon nitride film. However, example embodiments are not limited to the above examples. The diffusion barrier 65 may be formed on the sidewalls of the first and second contact holes HA and HB without forming the mask M3.

Referring to FIG. 1E, barrier metal layers 70 may be formed in the first and second contact holes HA and HB. The barrier metal layers 70 may be formed, for example, by performing a blanket deposition process without using a mask. The barrier metal layers 70 may be formed by performing, for example, a CVD or atomic layer deposition (ALD) process capable of forming a conformal film. The barrier metal layers 70 may also be formed, for example, by performing a physical vapor deposition (PVD) (e.g., a sputter process). The barrier metal layers 70 may be, for example, titanium (Ti), Nickel (Ni), cobalt (Co), palladium (Pd), platinum (Pt), and/or alloys thereof. The thickness of the barrier metal layers 70 may be from about 10 Å to about 400 Å.

Silicide films 80A and 80B may be respectively formed between the barrier metal layers 70 and the exposed SiGe and Si epitaxial layers 42L and 41L by performing, for example, thermal processing at a relatively low temperature (e.g., from about 300° C. to about 650° C.). According to one or more example embodiments, the silicide films 80A and 80B may locally remain only on the lower portions of the first and second contact holes HA and HB by removing the residue of barrier metal layers 70 which do not participate in the silicide reaction, by performing an appropriate etch.

The silicide films 80A and 80B having different compositions may be formed in the first and second contact holes HA and HB. The silicide film 80A in the first contact holes HA may be a M(Si1-yGey) film containing Ge due to the SiGe epitaxial layer 42L and the silicide film 80B in the second contact holes HB may be a MSi film due to the exposed Si epitaxial layer 41L. As illustrated in FIG. 1F, contact plugs 90 may be formed on the silicide films 80A and 80B in the first and second contact holes HA and HB (e.g., to fill the first and second contact holes 80A and 80B). The contact plugs 90 may include, for example, tungsten (W), aluminum (Al), copper (Cu), molybdenum (Mo), titanium (Ti), tantalum (Ta), ruthenium (Ru), and/or alloys thereof. However, example embodiments are not limited to the above materials. The contact plugs 90 may be, for example, a conductive nitride of the above-mentioned metals. The semiconductor device 100 may include additional circuitry, for example, power supply circuitry and interconnections to the contact plugs 90. The semiconductor device 100 may function as, for example, a P-channel MOSFET in a peripheral circuit region of dynamic random access memory (DRAM) and an N-channel MOSFET in the peripheral circuit region and a memory cell region.

On both of the first and second active regions, the silicide films 80A and 80B that contact the contact plugs 90 may reduce the height of Schottky barriers in contact regions and thus reduce sheet resistance. In the first active region on which the P-channel field-effect transistor 50A may be formed, during the silicide reaction between the SiGe epitaxial layer 42L and the barrier metal layers 70, Si having reactivity higher than that of Ge reacts more dominantly than Ge. As a result, concentration of Ge may increase at an interface between the SiGe epitaxial layer 42L and the barrier metal layers 70. As the concentration of Ge increases, a band gap of contact regions may be reduced. The reduced band gap may reduce the height of Schottky barriers and thus contact resistance of the P-channel field-effect transistor 50A may be considerably reduced.

According to example embodiments, for the P-channel and N-channel field-effect transistors 50A and 50B, the silicide films 80A and 80B having low Schottky barriers may be simultaneously formed and formed without performing a blocking process, by forming the double epitaxial layer 40E1 for each of the P-channel and N-channel field-effect transistors 50A and 50B simultaneously, and by controlling depths of the first and second contact holes HA and HB that expose the double epitaxial layer 40E1 formed under the interlayer insulating film 60.

Figure 2A:
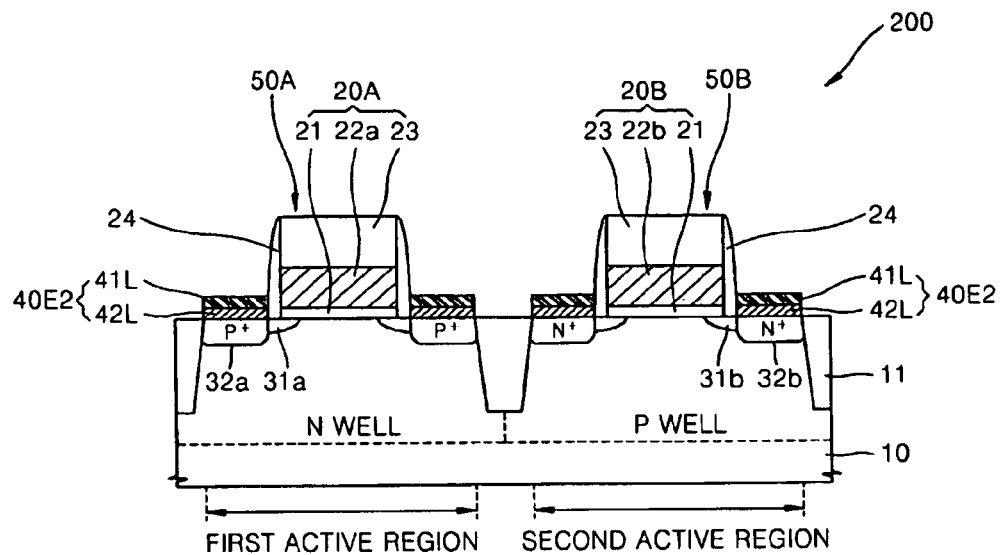
FIGS. 2A-2D are cross-sectional diagrams illustrating methods of manufacturing a semiconductor device according to example embodiments.

FIGS. 2A-2D are cross-sectional diagrams illustrating methods of manufacturing a semiconductor device 200 according to example embodiments. In FIGS. 2A-2D, repeated descriptions of elements having the same reference numerals as in FIGS. 1A-1F may not be provided. Referring to FIG. 2A, P-channel and N-channel field-effect transistors 50A and 50B may be respectively formed on first and second active regions of a substrate 10. A SiGe epitaxial layer 42L may be formed on exposed source/drain regions 32a and 32b of the first and second active regions. A Si epitaxial layer 41L may be formed on the SiGe epitaxial layer 42L of the first and second active regions. The SiGe epitaxial layers 42L may be simultaneously formed on the first and second active regions by using, for example, selective epitaxial growth. The Si epitaxial layers 41L may be simultaneously formed on the first and second active regions by using, for example, selective epitaxial growth. A double epitaxial layer 40E2 including the SiGe and Si epitaxial layers 42L and 41L may have a reversed stack order in comparison with the double epitaxial layer 40E1 illustrated in FIG. 1A.

Ion implantation may be performed, for example, on the double epitaxial layer 40E2 of the first and second active regions. However, example embodiments are not so limited. As will be described later with reference to FIGS. 2B and 2C, ion implantation may be performed, for example, on a contact pad layer 40PA of the first active region, which may be exposed after forming first contact holes HA in the interlayer insulating film 60. Another ion implantation may be also performed, for example, on a contact pad layer 40PB of the second active region, which is exposed after forming the second contact holes HB in the interlayer insulating film 60. Although not illustrated, the double epitaxial layer 40E2 may be extended over regions of a device isolation film 11.

According to one or more example embodiments, prior to forming the double epitaxial layer 40E2, trench regions (see a reference numeral 10T of FIG. 3C) may be formed in regions of the substrate 10 between a gate spacer 24 and the device isolation film 11 of the first active region. The SiGe epitaxial layer 42L formed on the first active region may be in the trench regions (e.g., fill the trench regions). The SiGe epitaxial layer 42L in the trench regions may apply compressive stress to a channel of the P-channel field-effect transistor 50A. Hole mobility of the P-channel field-effect transistor 50A may be improved and thus an on current may be enhanced, which will be fully described later with reference to FIGS. 3A-3F.

Figure 2B:
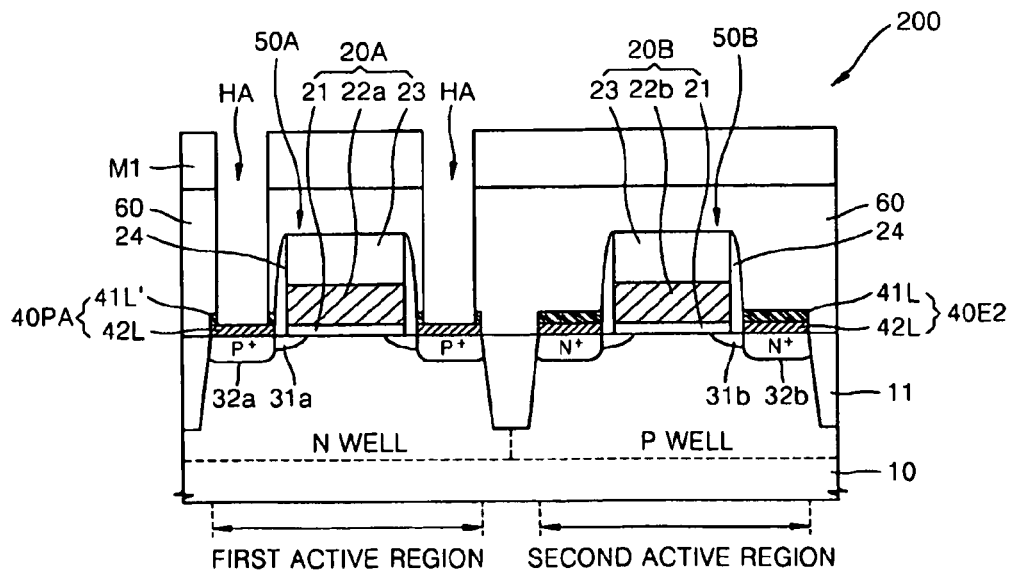

Referring to FIG. 2B, an interlayer insulating film 60 may be formed on the substrate 10 so as to cover upper regions of the P-channel and N-channel field-effect transistors 50A and 50B and the double epitaxial layer 40E2. A mask M1 for exposing regions in which first contact holes HA are to be formed may be formed on the interlayer insulating film 60. The first contact holes HA may be formed in the interlayer insulating film 60 by performing, for example, an etch using the mask M1. By controlling the etch depth of the first contact holes HA, lower regions of the first contact holes HA may penetrate through a Si epitaxial layer 41L' to expose the underlying SiGe epitaxial layer 42L. The etching of the first contact holes HA may be continuously performed on the interlayer insulating film 60 and the Si epitaxial layer 41L by using the same etch gas, or may be discontinuously performed by using different well-known etch gases in consideration of etch selectivity therebetween.

Figure 2C:
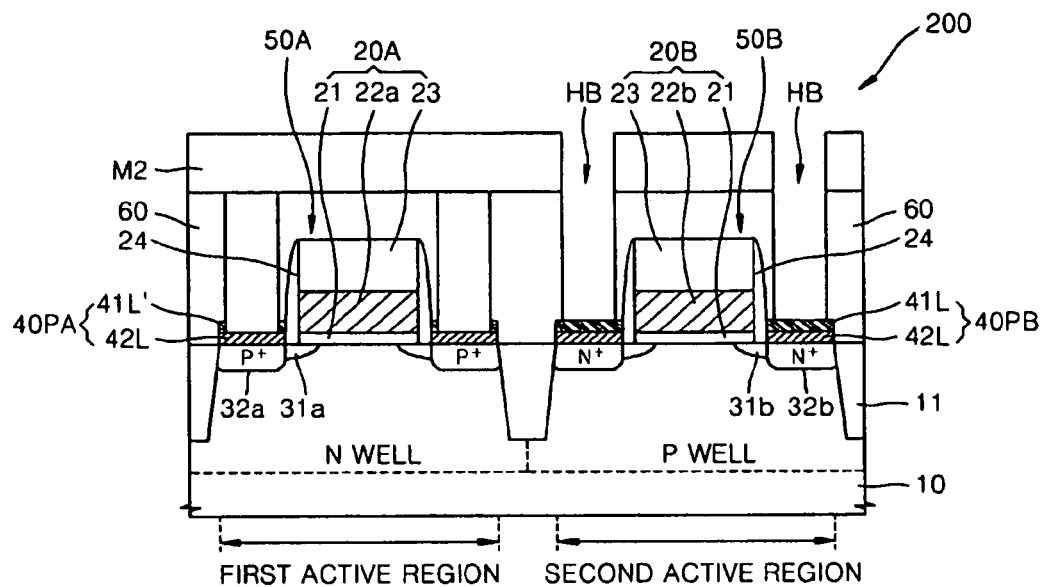

Referring to FIG. 2C, a mask M2 for exposing regions in which the second contact holes HB are to be formed may be formed on the interlayer insulating film 60. The second contact holes HB may be formed in the interlayer insulating film 60 by performing, for example, plasma dry etching. By controlling an etch depth of the second contact holes HB, lower regions of the second contact holes HB may expose the Si epitaxial layer 41L. The contact pad layer 40PB for the N-channel field-effect transistor 50B may be formed. According to example embodiments illustrated in FIGS. 2A-2D, sidewalls of the second contact holes HB do not expose the SiGe epitaxial layer 42L and a diffusion barrier 65 as illustrated in FIG. 1D may be omitted.

Figure 2D:
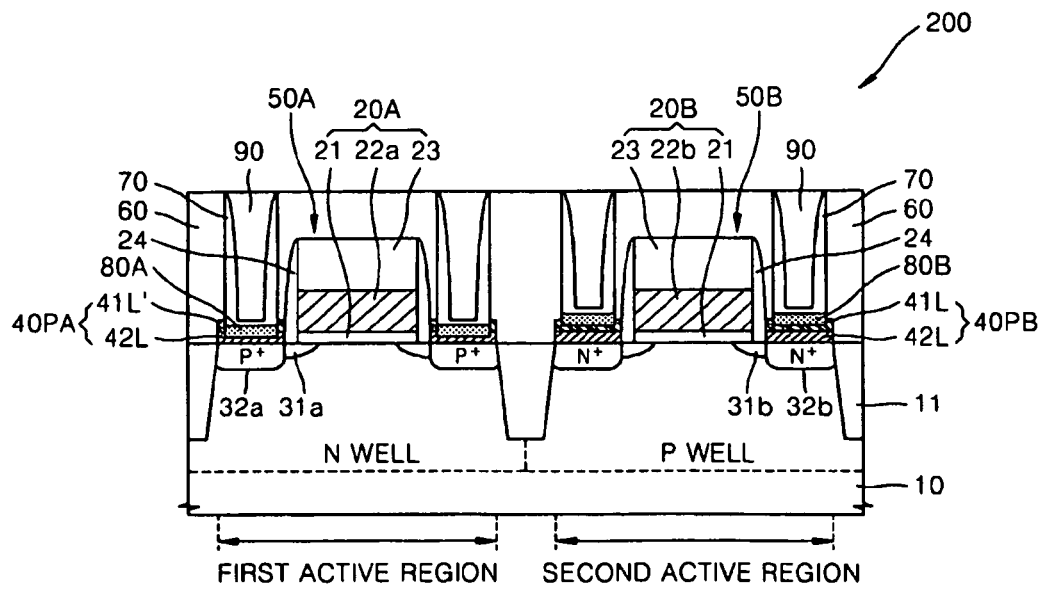

Referring to FIG. 2D, barrier metal layers 70 may be formed in the first and second contact holes HA and HB. The barrier metal layers 70 may be formed by performing, for example, a blanket deposition process without a mask. The thickness of the barrier metal layers 70 may be, for example, from about 10 Å to about 400 Å. By performing a thermal anneal, the barrier metal layers 70 and the exposed SiGe and Si epitaxial layers 42L and 41L may react to each other, and the silicide films 80A and 80B may be formed at interfaces between the barrier metal layers 70 and the exposed SiGe and Si epitaxial layers 42L and 41L. According to one or more example embodiments, the silicide films 80A and 80B may locally remain only on the lower portions of the first and second contact holes HA and HB, and residue of the barrier metal layers 70 (e.g., the barrier metal layers 70 that did not participate in the silicide reaction), may be removed by performing, for example, an appropriate barrier metal etch. The silicide films 80A and 80B having different compositions may be formed in the first and second contact holes HA and HB. The silicide film 80A in the first contact holes HA may be a M(Si1-yGey) film containing Ge due to the exposed SiGe epitaxial layer 42L, and the silicide film 80B in the second contact holes HB may be a MSi film due to the Si epitaxial layer 41L.

Contact plugs 90 may be formed on the silicide films 80A and 80B in the first and second contact holes HA and HB (e.g., to fill the contact holes HA and HB) and the semiconductor device 200 may include appropriate metal interconnections. According to example embodiments, for the P-channel and N-channel field-effect transistors 50A and 50B, the silicide films 80A and 80B having low Schottky barriers may be simultaneously formed without performing a blocking process, by forming the double epitaxial layer 40E2 for each of the P-channel and N-channel field-effect transistors 50A and 50B simultaneously, and by controlling depths of the first and second contact holes HA and HB that expose the double epitaxial layer 40E2 formed under the interlayer insulating film 60.

Figure 3A:
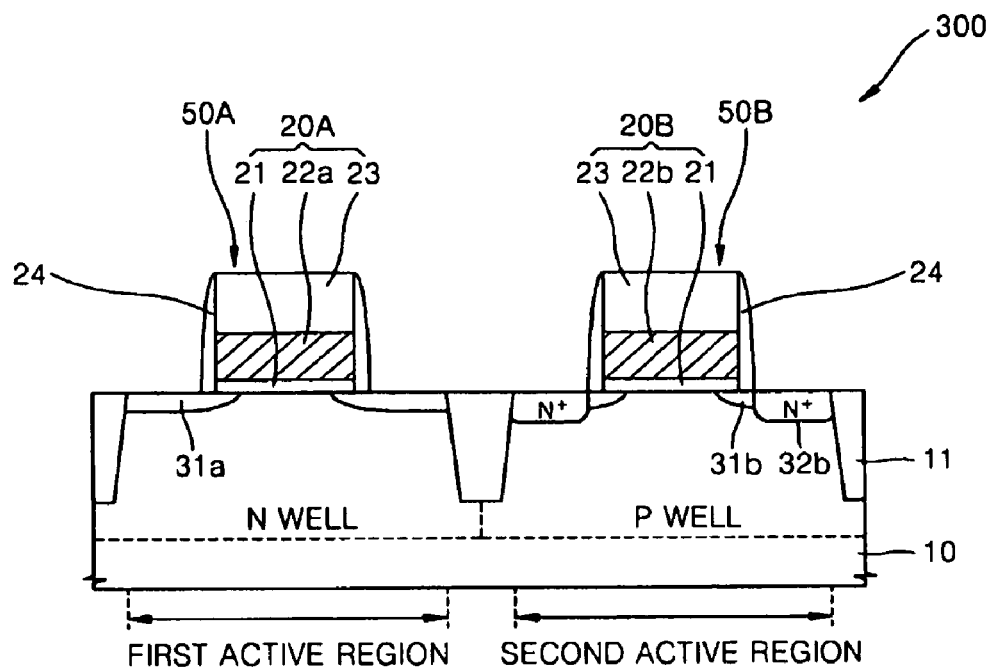
FIGS. 3A-3F are cross-sectional diagrams illustrating methods of manufacturing a semiconductor device according to example embodiments.

FIGS. 3A-3F are cross-sectional diagrams illustrating methods of manufacturing a semiconductor device 300 according to example embodiments. In FIGS. 3A-3F, repeated descriptions of elements having the same reference numerals as in FIGS. 1A-1F and 2A-2D may not be provided. Referring to FIG. 3A, first and second gate stacks 20A and 20B may be respectively formed on first and second active regions of a substrate 10. The first and second gate stacks 20A and 20B may include a gate insulating layer 21, gate conductive films 22a and 22b, and optionally a capping film 23. LDD regions 31a and 31b may be formed by performing ion implantation (e.g., after forming the first and second gate stacks 20A and 20B). A gate spacer 24 may be formed on sidewalls of the first and second gate stacks 20A and 20B. An appropriate mask (not shown) may be formed by performing a photolithography process and heavily doped source/drain regions 32b may be formed in the second active region of the substrate 10.

Figure 3B:
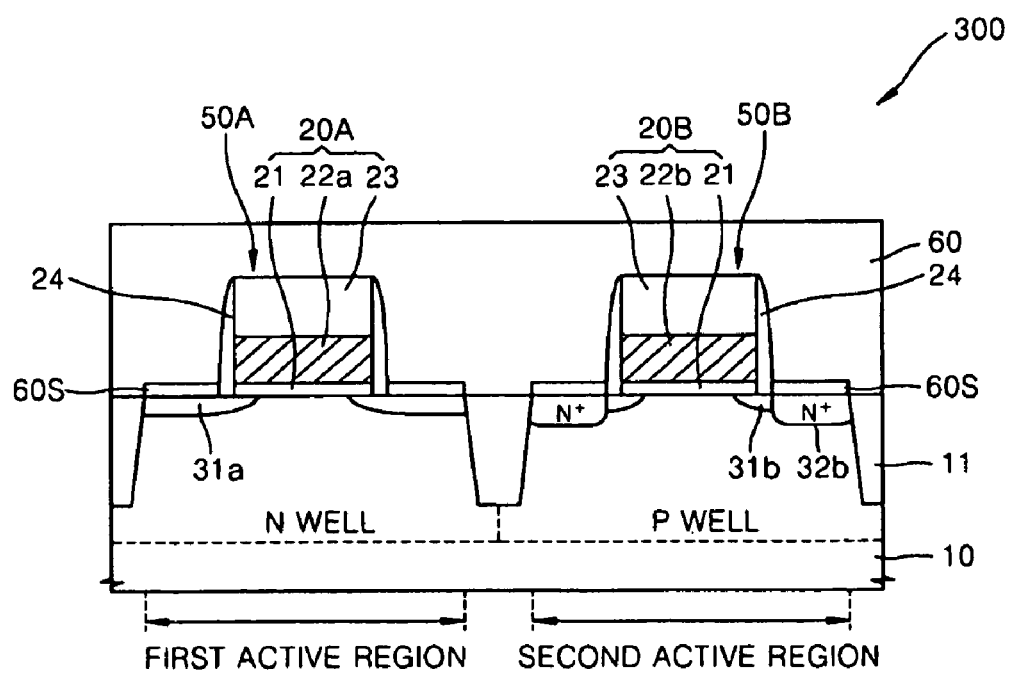

Referring to FIG. 3B, the interlayer insulating film 60 may be formed on the substrate 10 so as to cover the P-channel and N-channel field-effect transistors 50A and 50B. According to one or more example embodiments, in order to accurately control over-etching of the substrate 10, which will be described later, an etch stop 60S may be formed on the exposed first and second active regions before forming the interlayer insulating film 60. The etch stop 60S may be formed of a material having etch selectivity with respect to the interlayer insulating film 60. For example, if the interlayer insulating film 60 is a silicon oxide film, the etch stop 60S may be a silicon nitride film having etch selectivity with respect to the silicon oxide film.

Figure 3C:
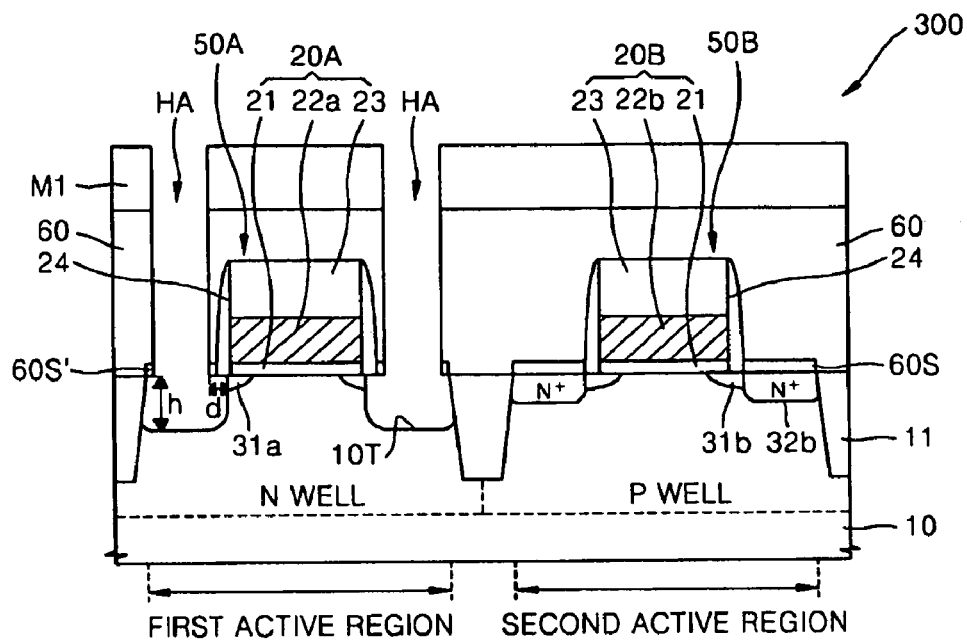

Referring to FIG. 3C, a mask M1 for exposing regions in which the first contact holes HA are to be formed may be formed on the interlayer insulating film 60. The first contact holes HA may be formed by performing, for example, an etch process using the mask M1 so as to expose the first active region of the substrate 10. Trench regions 10T that may be adjacent to channel of the P-channel field-effect transistor 50A may be formed by performing an etch process on the first active region exposed by the first contact holes HA. A depth h of the trench regions 10T may be controlled so that compressive deformation of the channel is caused by a SiGe epitaxial layer (see a reference numeral 43L of FIG. 3D) that is deposited in the trench regions 10T (e.g., filling the trench regions 10T). The depth h of the trench regions 10T may be, for example, from about 100 Å to about 1500 Å. A reference numeral 60S' may represent the etch stop that is penetrated by the first contact holes HA.

The etch for forming the first contact holes HA and the trench regions 10T may be, for example, a plasma etch continuously performed by using the same etch gas. Alternatively, the etching of the first contact holes HA and the trench regions 10T may be discontinuously performed by using different well-known etching gases in consideration of etch selectivity therebetween. The first contact holes HA may be formed by, for example, using an anisotropic etch and the trench regions 10T may be formed by using an isotropic etch as illustrated in FIG. 3C. For example, the anisotropic etch for forming the first contact holes HA may be a reactive ion etch (REI) using plasma. The isotropic etch for forming the trench regions 10T may be, for example, a dry etch using plasma or a wet etch using an etchant. An undercut d caused by the isotropic etching of the trench regions 10T may be from about 30 Å to about 1500 Å in a direction parallel to a principal plane of the substrate 10.

Figure 3D:
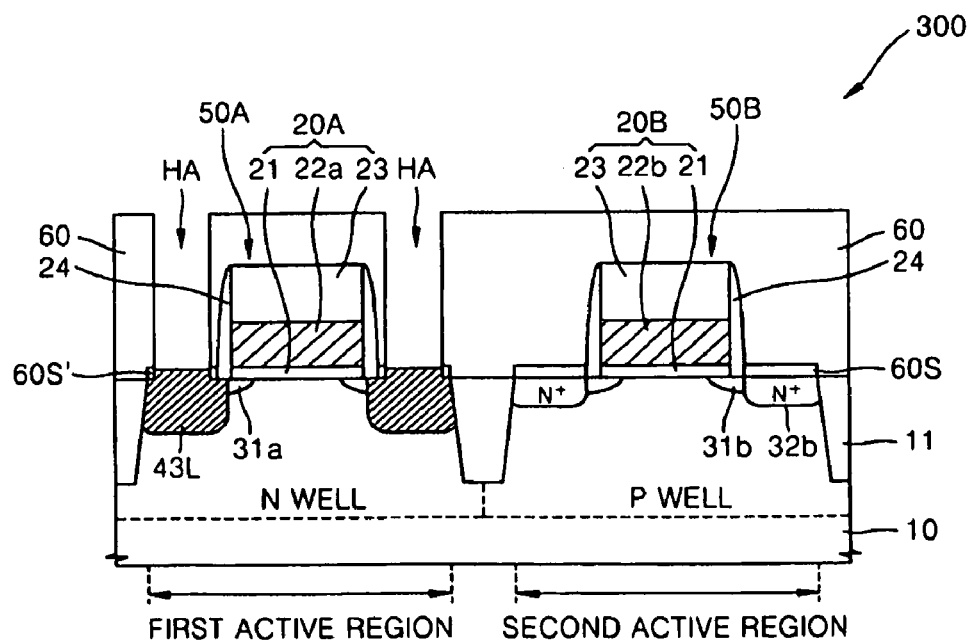

Referring to FIG. 3D, the mask M1 may be removed and a SiGe epitaxial layer 43L may be deposited in the trench regions 10T of the first active region (e.g., filling the trench regions 10T). The SiGe epitaxial layer 43L may be formed by, for example, using a selective epitaxial growth. Concentration of Ge in the filled SiGe epitaxial layer 43L may be from about 3% to about 50%. The thickness of the SiGe epitaxial layer 43L may be from about 100 Å to about 1500 Å. The thickness of the SiGe epitaxial layer 43L may be equal to the depth h of the trench regions 10T and/or may be greater than the depth h of the trench regions 10T as illustrated in FIG. 3D. However, example embodiments are not limited thereto and the thickness of the SiGe epitaxial layer 43L may be less than the depth h of the trench regions 10T.

If an isotropic etch is used to form the trench regions 10T, the distance between the channel of the P-channel field-effect transistor 50A and the SiGe epitaxial layer 43L may be reduced by the undercut d and a channel compressive stress effect caused by the SiGe epitaxial layer 43L may be increased. When a silicon monocrystalline substrate is used as the substrate 10, if a channel direction of the P-channel field-effect transistor 50A is the <110> direction, hole mobility in the channel may be maximized and/or improved. According to example embodiments, improvement of hole mobility due to the SiGe epitaxial layer 43L may be optimized and/or increased by designing the semiconductor device 300 to align the channel of the P-channel field-effect transistor 50A in the <110> direction.

According to one or more example embodiments, in order to form source/drain regions of the P-channel field-effect transistor 50A, an ion implantation may be performed on the SiGe epitaxial layer 43L. Alternatively, the SiGe epitaxial layer 43L may be doped by in-situ doping. For example, if a group III element-containing gas such as B2H5 is used in addition to a forming gas of the SiGe epitaxial layer 43L, a P-type heavily-doped SiGe epitaxial layer 43L may be formed.

Figure 3E:
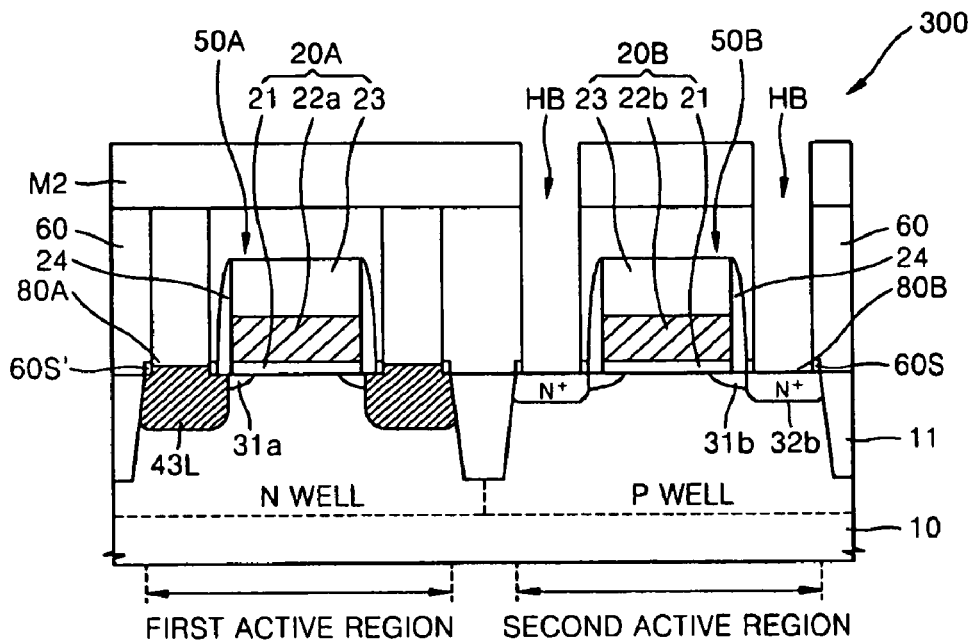
Figure 3F:
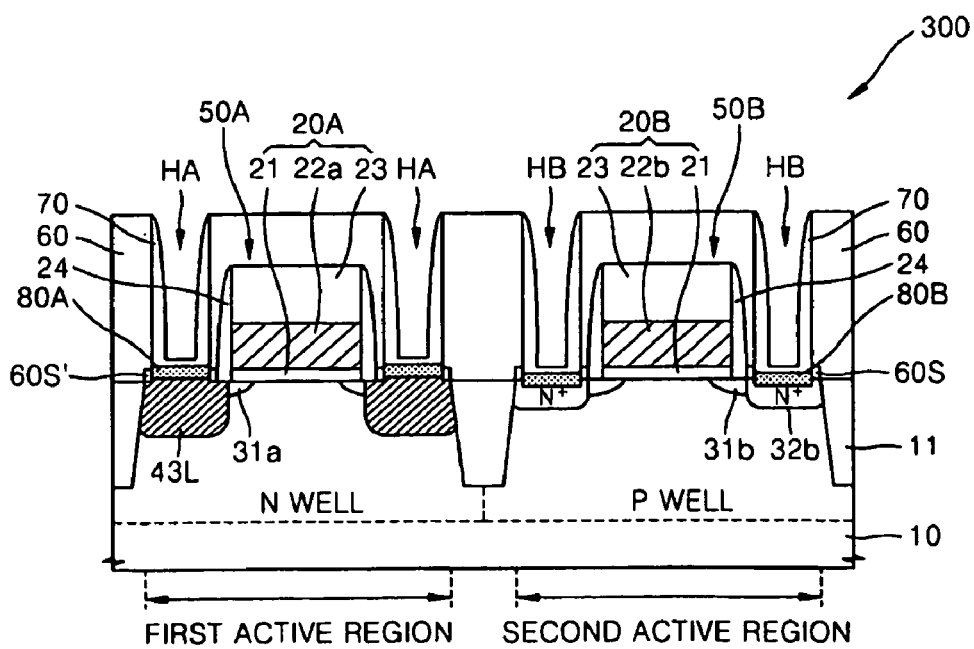

Referring to FIG. 3E, the mask M2 for exposing regions in which the second contact holes HB are to be formed may be formed on the interlayer insulating film 60. The second contact holes HB may be formed in the interlayer insulating film 60. By controlling an etch depth of the second contact holes HB, lower portions of the second contact holes HB may expose the second active region of the substrate 10. Referring to FIG. 3F, barrier metal layers 70 may be formed in the first and second contact holes HA and HB by performing a blanket deposition process. The thickness of the barrier metal layers 70 may be from about 10 Å to about 400 Å.

The barrier metal layers 70 may be thermally annealed. Due to thermal annealing, the silicide film 80A may be formed on the first active region between the barrier metal layers 70 and the SiGe epitaxial layer 43L, and the silicide film 80B may be formed on the second active region between the barrier metal layers 70 and the exposed source/drain regions 32b of the substrate 10. The silicide films 80A and 80B having different compositions may be formed in the first and second contact holes HA and HB. The silicide film 80A in the first contact holes HA may be a M(Si1-yGey) film containing Ge due to the exposed SiGe epitaxial layer 43L, and the silicide film 80B in the second contact holes HB may be a MSi film due to the Si of the exposed source/drain regions 32b.

Contact plugs (see a reference numeral 90 of FIG. 1F) may be formed on the silicide films 80A and 80B of the first and second contact holes HA and HB (e.g., to fill the first and second contact holes HA and HB). The semiconductor device 300 may include well-known metal wiring formed by a well-known metal wiring process in the art. According to example embodiments, the first contact holes HA may be formed after forming the interlayer insulating film 60, and then the SiGe epitaxial layer 43L may be formed by using the first contact holes HA. A blocking film for passivating the second active region may not be needed in order to form the filled SiGe epitaxial layer 43L only in the first active region.

Conventionally, a blocking film may be formed on the second active region in order to form a SiGe epitaxial layer on the first active region. In order to form the blocking film, for example, a silicon nitride film may be formed on an entire surface of a substrate, and a photolithography and an etching are performed so that the silicon nitride film covers the second active region and exposes only the first active region. A SiGe epitaxial layer may be formed on the exposed first active region and an etch process for removing the blocking film that covers the second active region has to be performed in order to complete a transistor of the second active region. However, according to example embodiments, an interlayer insulating film may function as a blocking film, a transistor forming process such as a forming process of a SiGe epitaxial layer may be performed by using first and second contact holes, and a photolithography step and an etch step may be eliminated.

Figure 4:
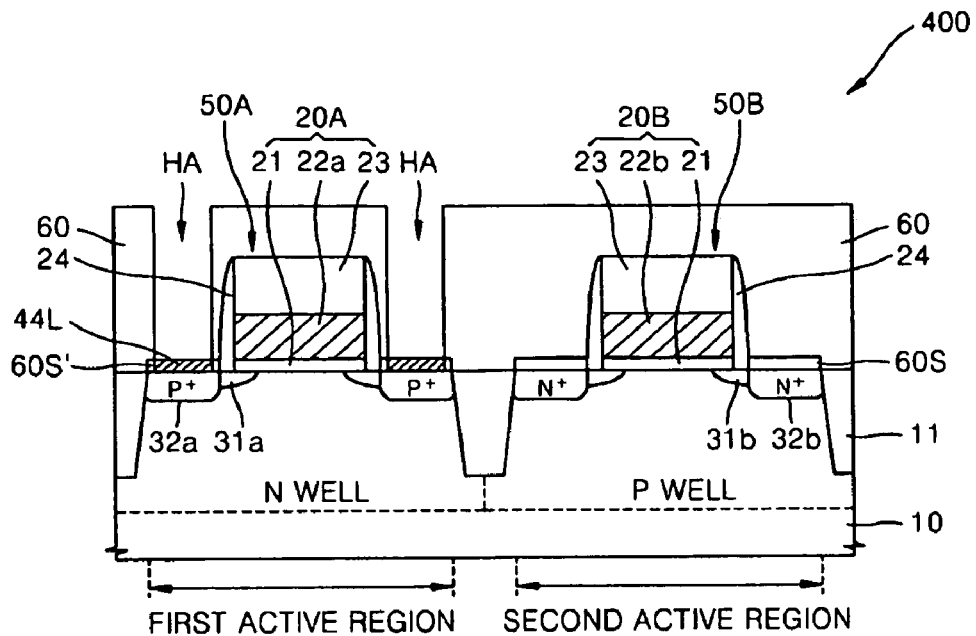

FIG. 4 is a cross-sectional diagram illustrating methods of manufacturing a semiconductor device 400 according to example embodiments. Referring to FIG. 4, an interlayer insulating film 60 may be formed on a substrate 10 so as to cover P-channel and N-channel field-effect transistors 50A and 50B. First contact holes HA may be formed by using an appropriate mask so as to expose a first active region of the substrate 10. A SiGe epitaxial layer 44L may be formed on the first active region exposed by lower portions of the first contact holes HA. The SiGe epitaxial layer 44L may be formed by using, for example, selective epitaxial growth.

Second contact holes HB may be formed in the interlayer insulating film 60 as described above with reference to FIG. 3E, a barrier metal layers 70 may be formed in the first and second contact holes HA and HB and thermal annealing may be performed, as described above with reference to FIG. 3F. Silicide films 80A and 80B having different compositions may be formed in the first and second contact holes HA and HB. The silicide film 80A in the first contact holes HA may be a M(Si1-yGey) film containing Ge due to the SiGe epitaxial layer 44L and the silicide film 80B in the second contact holes HB may be a MSi film due to the exposed second active region. According to example embodiments, the first contact holes HA formed in the interlayer insulating film 60 may be used to form the M(Si1-yGey) film and thus the M(Si1-yGey) film capable of improving contact resistance of the P-channel field-effect transistor 50A may be obtained without additionally performing a photolithography or etching process.

Figure 5:
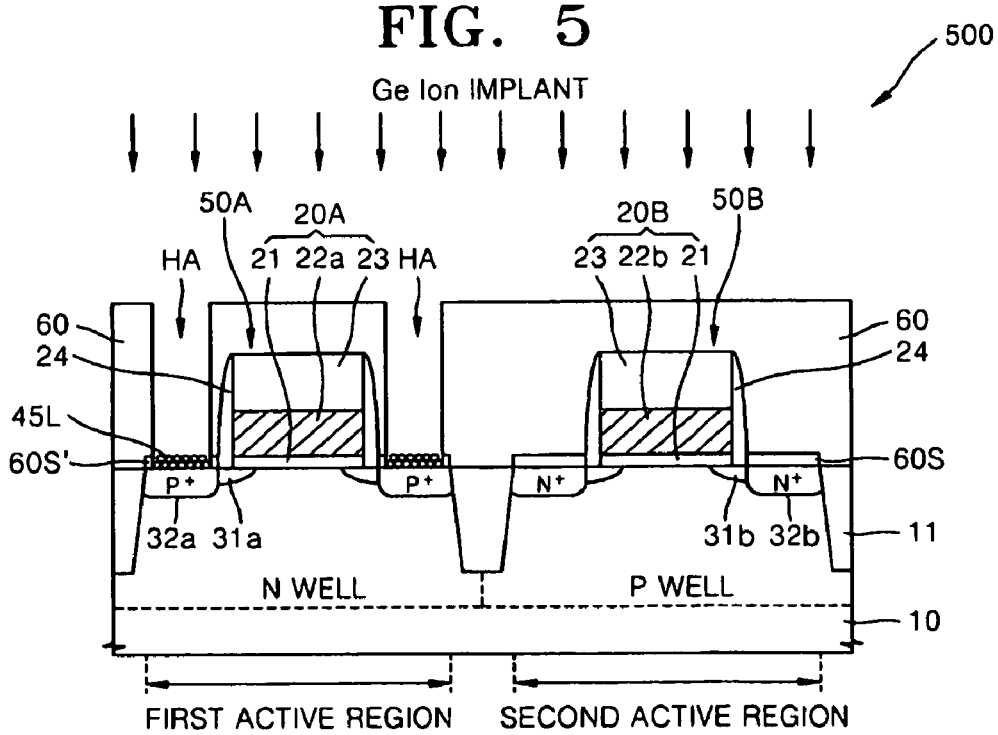

FIG. 5 is a cross-sectional diagram illustrating methods of manufacturing a semiconductor device 500 according to example embodiments. Referring to FIG. 5, an interlayer insulating film 60 may be formed on a substrate 10 so as to cover P-channel and N-channel field-effect transistors 50A and 50B. First contact holes HA may be formed by using an appropriate mask so as to expose a first active region of the substrate 10. A Ge ion implantation may be performed to provide Ge atoms to the first active region exposed by lower portions of the first contact holes HA. According to acceleration energy of Ge ions, the Ge ions may form a Ge atomic layer 45L piled on the first active region as illustrated in FIG. 5 and/or may penetrate into source/drain regions 32a so as to form a SiGe layer in upper surfaces of the source/drain regions 32a. According to one or more example embodiments, thermal annealing may be performed after performing the Ge ion implantation.

Example embodiments are not limited to Ge ion implantation. For example, in order to provide the Ge atoms to the first active region exposed by the lower surfaces of the first contact holes HA, the Ge atomic layer 45L may be formed by, for example, using a pulsed laser ablation deposition (PLAD) and/or a gas cluster ion beam (GCIB) deposition. According to example embodiments, the Ge atomic layer 45L may be monocrystalline, amorphous, microcrystalline, and/or polycrystalline. Second contact holes HB may be formed in the interlayer insulating film 60 as described above with reference to FIG. 3E, barrier metal layers 70 may be formed in the first and second contact holes HA and HB and thermal annealing may be performed, as described above with reference to FIG. 3F. Silicide films 80A and 80B having different compositions may be formed in the first and second contact holes HA and HB. The silicide film 80A in the first contact holes HA may be a M(Si1-yGey) film including the Ge atomic layer 45L and the silicide film 80B in the second contact holes HB may be a MSi film due to the exposed second active region.

According to example embodiments, the first contact holes HA formed in the interlayer insulating film 60 may be used to form the M(Si1-yGey) film capable of improving contact resistance of the P-channel field-effect transistor 50A and the M(Si1-yGey) film may be obtained. A photolithography and/or etch process may be eliminated with respect to conventional methods. Example embodiments described with reference to the attached drawings may be implemented independently or in combination with the other embodiments. For example, the SiGe epitaxial layer 42L illustrated in FIGS. 1A-1F may comprise the Ge atomic layer 45L illustrated in FIG. 5. While example embodiments have been particularly shown and described, it will be understood by one of ordinary skill in the art that variations in form and detail may be made therein without departing from the spirit and scope of the claims.

What is claimed is:
1. A method of manufacturing a semiconductor device, the method comprising:
    forming a first active region for a P-channel field-effect transistor in a substrate;

forming a second active region for an N-channel field-effect transistor in the substrate;
forming a first gate stack on the first active region;
forming a second gate stack on the second active region;
forming a first layer on the first active region in a region where the first gate stack is not formed,
forming a second layer on the second active region in a region where the second gate stack is not formed, the first and second layers including a silicon germanium (SiGe) epitaxial layer sequentially stacked on a silicon (Si) epitaxial layer;
forming an interlayer insulating film to cover upper regions of the first and second gate stacks and the first and second layers;
forming a first contact hole in the interlayer insulating film, the first contact hole including a first lower region exposing the SiGe epitaxial layer of the first layer;
forming a second contact hole in the interlayer insulating film, the second contact hole including a second lower region penetrating through the SiGe epitaxial layer of the second layer and exposing the Si epitaxial layer of the second layer;
forming a first metal silicide film including germanium (Ge) in the first lower region;
forming a second metal silicide film not including Ge in the second lower region simultaneously with the forming of the first metal silicide film; and
forming contact plugs on the first and second metal silicide films in the first and second contact holes.

2. The method of claim 1, wherein the forming of the first and second layers is performed by selective epitaxial growth.

3. The method of claim 1, further comprising:
forming a diffusion barrier on sidewalls of the second contact hole so as to cover a region of the exposed SiGe epitaxial layer.

4. A method of manufacturing a semiconductor device, the method comprising:
forming a first active region for a P-channel field-effect transistor in a substrate;
forming a second active region for an N-channel field-effect transistor in the substrate;
forming a first gate stack on the first active region;
forming a second gate stack on the second active region;
forming a first layer on the first active region in a region where the first gate stacks are not formed;
forming a second layer simultaneously with the forming of the first layer on the second active region in a region where the second gate stacks are not formed, the first and second layers including a silicon (Si) epitaxial layer sequentially stacked on a silicon germanium (SiGe) layer;
forming an interlayer insulating film to cover upper regions of the first and second gate stacks and the first and second layers;
forming a first contact hole in the interlayer insulating film, the first contact hole including a first lower region penetrating through the Si epitaxial layer of the first layer and exposing the SiGe epitaxial layer;
forming a second contact hole in the interlayer insulating film, the second contact hole including a second lower region exposing the Si epitaxial layer of the second layer;
forming a first metal silicide film including Ge in the first lower region;
forming a second metal silicide film not including Ge in the second lower region simultaneously with first metal silicide film; and
forming contact plugs on the first and second metal silicide films in the first and second contact holes.

5. The method of claim 4, wherein the forming of the first and second layers is performed by selective epitaxial growth.

* * * * *

UNITED STATES PATENT AND TRADEMARK OFFICE
CERTIFICATE OF CORRECTION

PATENT NO. : 8,324,043 B2  
APPLICATION NO. : 13/137733  
DATED : December 4, 2012  
INVENTOR(S) : Kim et al.

Page 1 of 1

It is certified that error appears in the above-identified patent and that said Letters Patent is hereby corrected as shown below:

On the title page, Item [62] should read

Related U.S. Application Data

[62]   Division of application No. 12/591,249, filed on Nov. 13, 2009, now Pat. No. 8,039,902.

Signed and Sealed this  
Seventh Day of January, 2014

Margaret A. Focarino  
*Commissioner for Patents of the United States Patent and Trademark Office*